United States Patent
Cheng et al.

(10) Patent No.: US 11,171,204 B2
(45) Date of Patent: Nov. 9, 2021

(54) HIGH THERMAL BUDGET COMPATIBLE PUNCH THROUGH STOP INTEGRATION USING DOPED GLASS

(71) Applicant: INTERNATIONAL BUSINESS MACHINES CORPORATION, Armonk, NY (US)

(72) Inventors: Kangguo Cheng, Schenectady, NY (US); Sanjay C. Mehta, Niskayuna, NY (US); Xin Miao, Guilderland, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 16/681,128

(22) Filed: Nov. 12, 2019

(65) Prior Publication Data
US 2020/0083323 A1 Mar. 12, 2020

Related U.S. Application Data

(60) Continuation of application No. 15/790,753, filed on Oct. 23, 2017, now Pat. No. 10,580,855, which is a
(Continued)

(51) Int. Cl.
*H01L 29/06* (2006.01)
*H01L 29/49* (2006.01)
(Continued)

(52) U.S. Cl.
CPC .... *H01L 29/0638* (2013.01); *H01L 21/02274* (2013.01); *H01L 21/3065* (2013.01);
(Continued)

(58) Field of Classification Search
CPC ............... H01L 29/1083; H01L 29/66537
See application file for complete search history.

(56) References Cited

U.S. PATENT DOCUMENTS

| 8,441,050 B2 | 5/2013 | Luo et al. |
| 8,592,264 B2 | 11/2013 | Ando et al. |
| (Continued) | | |

OTHER PUBLICATIONS

List of IBM Patents or Patent Applications Treated as Related dated Nov. 12, 2019, 2 pages.
(Continued)

*Primary Examiner* — Moazzam Hossain
(74) *Attorney, Agent, or Firm* — Tutunjian & Bitetto, P.C.; Robert Sullivan

(57) ABSTRACT

A method of forming a punch through stop region in a fin structure is disclosed. The method may include forming a doped glass layer on a fin structure and forming a masking layer on the doped glass layer. The method may further include removing a portion of the masking layer from an active portion of the fin structure, and removing an exposed portion the doped glass layer that is present on the active portion of the fin structure. A remaining portion of the doped glass layer is present on the isolation portion of the fin structure. Dopant from the doped glass layer may then be diffused into the isolation portion of the fin structure to form the punch through stop region between the active portion of the fin structure and a supporting substrate.

20 Claims, 4 Drawing Sheets

Related U.S. Application Data division of application No. 15/208,186, filed on Jul. 12, 2016, now Pat. No. 9,985,096, which is a division of application No. 14/842,180, filed on Sep. 1, 2015, now Pat. No. 9,847,388.

(51) Int. Cl.

| | | |
|---|---|---|
| *H01L 29/78* | (2006.01) | |
| *H01L 29/10* | (2006.01) | |
| *H01L 29/08* | (2006.01) | |
| *H01L 29/66* | (2006.01) | |
| *H01L 21/3065* | (2006.01) | |
| *H01L 21/308* | (2006.01) | |
| *H01L 21/324* | (2006.01) | |
| *H01L 21/02* | (2006.01) | |

(52) U.S. Cl.
CPC ...... *H01L 21/3081* (2013.01); *H01L 21/3085* (2013.01); *H01L 21/324* (2013.01); *H01L 29/0649* (2013.01); *H01L 29/0653* (2013.01); *H01L 29/0847* (2013.01); *H01L 29/1083* (2013.01); *H01L 29/495* (2013.01); *H01L 29/4966* (2013.01); *H01L 29/66537* (2013.01); *H01L 29/66795* (2013.01); *H01L 29/66803* (2013.01); *H01L 29/7851* (2013.01)

(56) References Cited

U.S. PATENT DOCUMENTS

| | | |
|---|---|---|
| 8,994,112 B2 | 3/2015 | Doornbos et al. |
| 8,999,774 B2 | 4/2015 | Cheng et al. |
| 9,023,715 B2 | 5/2015 | Faul et al. |
| 2002/0094620 A1* | 7/2002 | Sandhu ................. H01L 21/265 438/197 |
| 2003/0168699 A1 | 9/2003 | Honda |
| 2008/0001224 A1 | 1/2008 | Kinoshita et al. |
| 2008/0079077 A1 | 4/2008 | Takeda et al. |
| 2009/0278196 A1 | 11/2009 | Chang et al. |
| 2012/0009744 A1 | 1/2012 | Inaba |
| 2013/0126972 A1 | 5/2013 | Wang et al. |
| 2013/0320294 A1 | 12/2013 | Cappellani et al. |
| 2014/0193959 A1 | 7/2014 | Lo et al. |
| 2015/0102392 A1 | 4/2015 | Yu et al. |
| 2015/0102424 A1 | 4/2015 | Colinge |
| 2015/0262861 A1 | 9/2015 | Hung et al. |
| 2015/0318211 A1 | 11/2015 | Guo et al. |
| 2015/0372144 A1* | 12/2015 | Fang ................ H01L 21/823821 257/192 |
| 2016/0181244 A1* | 6/2016 | Peng ............... H01L 21/823821 257/345 |
| 2016/0233319 A1* | 8/2016 | Lu ....................... H01L 21/2255 |
| 2016/0343623 A1 | 11/2016 | Fogel et al. |
| 2020/0259002 A1* | 8/2020 | Basker ............ H01L 21/31111 |

OTHER PUBLICATIONS

U.S. Office Action issued in related U.S. Appl. No. 15/208,186, dated Jul. 25, 2017, pp. 1-22.

Notice of Allowance with cited art in corresponding U.S. Appl. No. 15/787,065 dated Jul. 5, 2019.

Notice of Allowance issued in U.S. Appl. No. 16/681,104 dated Jul. 15, 2021, 10 pages.

* cited by examiner

HIGH THERMAL BUDGET COMPATIBLE PUNCH THROUGH STOP INTEGRATION USING DOPED GLASS

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming a punch through stop (PTS) region in a fin structure is provided that includes forming a doped glass layer on a fin structure, and forming a masking layer on the doped glass layer. A portion of the masking layer may then be removed from being over an active portion of the fin structure. A remaining portion of the masking layer may be present on the doped glass layer that is present on an isolation portion of the fin structure. In a following step, an exposed portion of the doped glass layer that is present over the active portion of the fin structure is removed. A remaining portion of the doped glass layer is present on the isolation portion of the fin structure. Dopant from the doped glass layer is diffused into the isolation portion of the fin structure to form the punch through stop (PTS) region between the active portion of the fin structure and a supporting substrate.

In another embodiment, a method of forming a semiconductor device is provided that includes forming a doped glass layer on a fin structure, and removing a portion the doped glass layer that is present on an active portion of the fin structure. A remaining portion of the doped glass layer is present on an isolation portion of the fin structure. Dopant from the doped glass layer may be diffused into the isolation portion of the fin structure to form a punch through stop (PTS) region between the active portion of the fin structure and a supporting substrate. A gate structure may be formed on a channel region of the active portion of the fin structure. Source and drain regions may be formed on the fin structure on opposing sides of the channel region.

In another aspect, a semiconductor device is provided that includes a fin structure including an active portion and an isolating portion. The active portion of the fin structure includes a channel region and source and drain regions on opposing sides of the channel region. The isolating portion of the fin structure includes a doped punch through stop (PTS) region that is present underlying the channel region and the source and drain regions of the active portion. The semiconductor device may further include a spacer of doped glass present on the isolation portion of the fin structure. The spacer of doped glass may not be present on the active portion. A gate structure is present on the channel region of the active portion of the fin structure.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
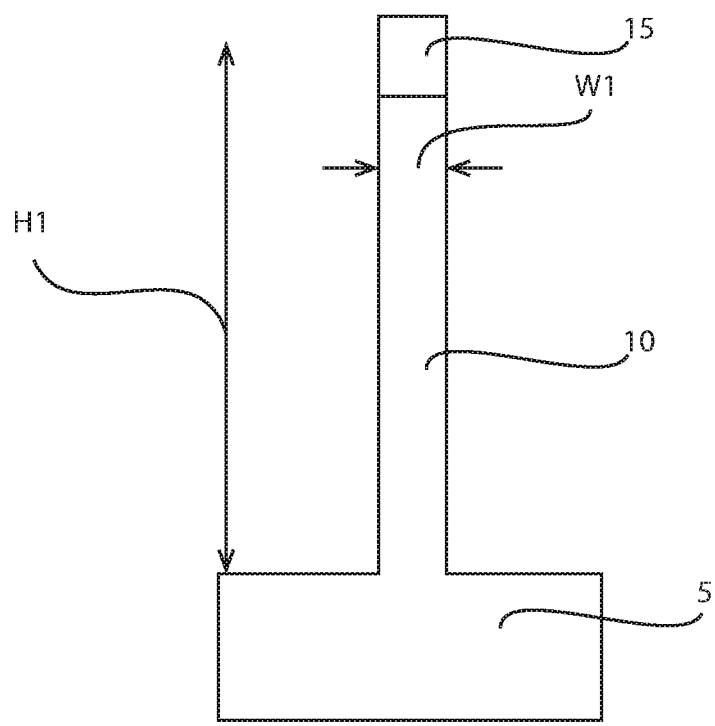
FIG. 1 is a side cross-sectional view that depicts forming at least one fin structure from a bulk semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure.

In some embodiments, the methods and structures disclosed herein provide a punch through stopper (PTS) region for reducing the incidence of leakage based performance degradation in FinFETs. It has been determined that the formation of punch through stopper (PTS) regions formed in FinFETs using prior methods have a number of disadvantages. For example, forming a punch through stopper (PTS) region in a fin structure by ion implantation produces a high concentration of the dopant for the punch through stopper (PTS) region in the at least the channel region of the FinFET. This results in a low mobility of charge carriers in the device, as well as a large variation in threshold voltage (Vt). Further, introducing punch through stopper (PTS) dopant into the channel region of a fin structure, using any method including diffusion from dopant layers, results in the same effect as implanting the dopant into the channel region. The present disclosure provides a means to introduce punch through stopper dopant to the portion of the fin structure underlying the channel region without introducing high concentrations of the punch through stopper (PTS) region dopant into the active region of the fin structure, i.e., the channel region and the source and drain region. More specifically, in some embodiments, the present disclosure provides a glass layer that is doped with punch through stopper (PTS) dopant that is present only adjacent to the isolation portion of the fin structure. The isolation portion of the fin structure is the portion of the fin structure that is present between the active portion of the fin structure and the supporting substrate that the fin structure is engaged to. In some embodiments, by diffusing dopant from the doped glass layer that is present adjacent to the isolation portion of the fin structure into the isolation portion of the fin structure, the present disclosure provides a punch through stopper (PTS) region without introducing a high concentration of punch through stopper (PTS) dopant to the active portion of the fin structure. The methods and structures of the present disclosure are now discussed with more detail referring to FIGS. 1-7.

FIG. 1 depicts one embodiment of forming at least one fin structure 10 from a semiconductor substrate. The at least one fin structure 10 may be formed from a bulk semiconductor substrate 5. The at least one fin structure 10 may be formed using photolithography and etch processes. In one embodiment, a hard mask 15 is formed on the bulk semiconductor substrate 1 prior to etch processing for forming the at least one fin structure 10. For example, a hard mask dielectric layer, such as a nitride or oxide material layer, may be blanked deposited atop the bulk semiconductor substrate 1 prior to etching to form the at least one fin structure 10. For example, the hard mask dielectric layer may be blanked deposited using a deposition process, such as chemical vapor deposition (CVD), e.g., plasma enhanced chemical vapor deposition (PECVD), chemical solution deposition, spin on deposition or physical vapor deposition. The hard mask dielectric layer may have a thickness ranging from 2 nm to 15 nm. In some examples, the blanket deposited hard mask dielectric layer may be composed of silicon nitride, e.g., $Si_3N_4$, silicon oxynitride or silicon oxide.

An etch mask, e.g., photoresist mask, may then be formed on the blanket deposited hard mask dielectric layer. To provide the photoresist mask, a photoresist layer is first positioned on the layer of the dielectric material that provides dielectric fin cap. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

The blanket deposited hard mask layer than may be etched using an etch process that is selective to at least the photoresist mask, wherein the portion of the blanket deposited hard mask layer protected by the photoresist mask remain to provide the hard mask 15 and the exposed portions of the blanket deposited hard mask layer are removed. The photoresist mask may then be removed.

The bulk semiconductor substrate 1 may then be etched using the hard mask 15 as an etch mask to form the fin structures 10. The etch process for forming the at least one fin structure 10 may be an anisotropic etch. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiments, the etch process for etching the bulk semiconductor substrate 1 and defining the at least one fin structure 10 is a timed etch. It is noted that the above description of the etch sequence for forming the fin structures is only one example, and the present disclosure is not intended to be limited to only this example. For example, the etch process for forming the at least one fin structure 10 may be included within a sidewall image transfer (SIT) process flow in which a mandrel structure is used to form a spacer, in which following formation of the spacer, the mandrel is removed and the spacer can function as an etch mask.

Still referring to FIG. 1, the etch process may continue until each of the fin structures 10 may have a height Hi ranging from 5 nm to 200 nm. In another embodiment, each of the fin structures 10 has a height Hi ranging from 10 nm to 100 nm. In one example, each of the fin structures 10 has a height Hi ranging from 20 nm to 50 nm. Each of the fin structures 10 may have a width $W_1$ of less than 15 nm. In another embodiment, each of the fin structures 10 has a width $W_1$ ranging from 3 nm to 8 nm. Although one fin structure 10 is depicted in FIG. 1, the present disclosure is not limited to only this example. It is noted that any number of fin structures 10 may be employed in accordance with the present disclosure.

In some embodiments, the at least one fin structure 10 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. A compound semiconductor may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the fin structures 10 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. It is noted that in some embodiments, the fin structures 10 are formed from the substrate 1. Therefore, in some embodiments, the fin structure 10 and the supporting substrate 1 have the same composition.

Figure 2:
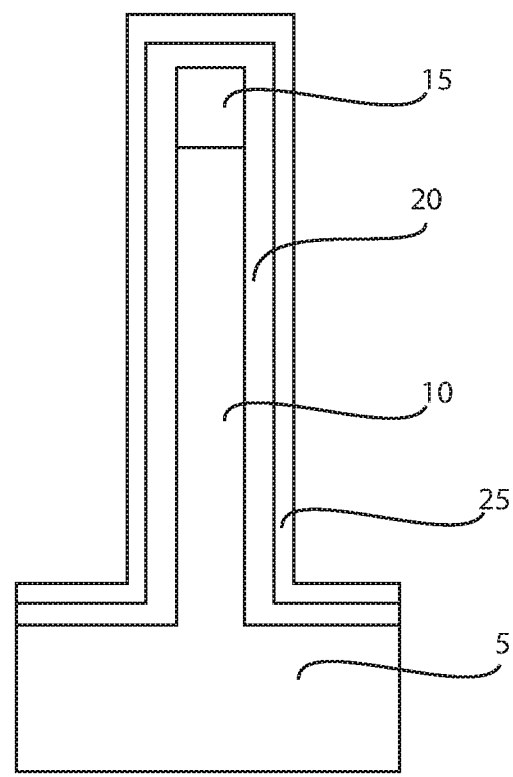
FIG. 2 is a side cross-sectional view depicting forming a doped glass layer on a fin structure, and forming a masking layer on the doped glass layer, in accordance with one embodiment of the present disclosure.

FIG. 2 depicts one embodiment of forming a doped glass layer 20 on the at least one fin structure 10, and forming a masking layer 25 on the doped glass layer 20. Each of the doped glass layer 20 and the masking layer 25 may be conformal layers. The term "conformal denotes a layer having a thickness that does not deviate from greater than or less than 30% of an average value for the thickness of the layer. The doped glass layer 20 may be formed on the sidewalls of the fin structure 10, the sidewalls of the hardmask 15, the upper surface of the hardmask 15 and the exposed upper surface of the supporting substrate 1. The doped glass layer 20 may be composed of a doped dielectric material. The dopant of the dielectric material for the doped glass layer 20 is selected to have an opposite conductivity type as the conductivity type of the source and drain regions. The term "conductivity type" means that the dopant is either a p-type dopant or an n-type dopant. The opposite conductivity type of a p-type dopant is an n-type dopant, and the opposite conductivity type of an n-type dopant is a p-type dopant. As used herein, "p-type" refers to the addition of impurities to an intrinsic semiconductor that creates deficiencies of valence electrons. For example, in a type IV semiconductor material, such as silicon (Si), examples of n-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon including fin structure 10, examples of n-type dopants, i.e., impurities, include but are not limited to antimony, arsenic and phosphorous.

In some examples, the conductivity type of the source and drain regions indicates the conductivity type of the device. For example, a p-type FinFET would have p-type source and drain regions, and an n-type FinFET would have n-type source and drain regions. The dopant of the doped glass layer 20 provides the dopant for the punch through stop (PST) region in the isolation portion of the fin structure 10. Therefore, the dopant of the doped glass layer 20 is selected to have an opposite conductivity as the dopant that provides the conductivity type of the FinFET, e.g., the dopant conductivity of the source and drain region. By having an opposite conductivity type as the conductivity type of the FinFET, the punch through stop (PST) region produces a repulsive field underlying the active portion of the FinFET that obstructs leakage of charge carriers out of the active portion of the fin structure 10.

The doped glass layer 20 is typically composed of a silicate glass that is doped with an n-type or p-type dopant. For example, the doped glass layer may be selected from the group consisting of borosilicateglass (BSG) (p-type silicate glass), phosphosilicate glass (PSG)(n-type silicate glass), and arsenosilicate glass (ASG)(n-type silicate glass). The doped glass layer 20 may be deposited using chemical vapor deposition (CVD), such as plasma enhanced CVD (PECVD) or metal organic chemical vapor deposition (MOCVD). The doped glass layer 20 may also be formed using chemical solution deposition or spin on deposition, e.g., spin on glass deposition. The dopant may be introduced to the doped glass layer in-situ. By "in-situ" it is meant that the dopant e.g., n-type or p-type, that is being introduced to the doped glass layer 20 is introduced during the deposition step that forms the doped glass layer 20. In some embodiments, the thickness of the doped glass layer 20 may range from 2 nm to 50 nm. In other embodiments, the thickness of the doped glass layer ranges from 5 nm to 25 nm.

Following the formation of the doped glass layer 20, the masking layer 25 is deposited. The masking layer 25 is composed of a material that may be etched selectively to the at least the doped glass layer 20. The term "selective" as used to describe a material removal process denotes that the rate of material removal for a first material is greater than the rate of removal for at least another material of the structure to which the material removal process is being applied. In some embodiments, the masking layer 25 may be an oxide, such as silicon oxide, a nitride, such as silicon nitride, or a silicon oxynitride. In yet other examples, the masking layer 25 can be composed of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), lanthanum aluminate ($LaAlO_3$), zirconium silicate ($ZrSiO_x$) and combinations thereof. It is noted that the above compositions are only examples of dielectric compositions that can be suitable for forming the masking layer 25, and it is not intended that the present disclosure be limited to only those examples. Any material that is suitable for selective etching relative to at least one of the doped glass layer 20 and the at least one fin structure 10 is suitable for use with the present disclosure.

Referring to FIG. 2, the masking layer 25 may be blanket deposited over the entirety of the doped glass layer. The masking layer 25 may be deposited using chemical vapor deposition (CVD), such as plasma enhanced CVD (PECVD) or metal organic chemical vapor deposition (MOCVD). The masking layer 25 may also be formed using chemical solution deposition or physical vapor deposition. The masking layer 25 may have a thickness ranging from 2 nm to 50 nm. In other embodiments, the thickness of the masking layer 25 ranges from 5 nm to 25 nm.

Figure 3:
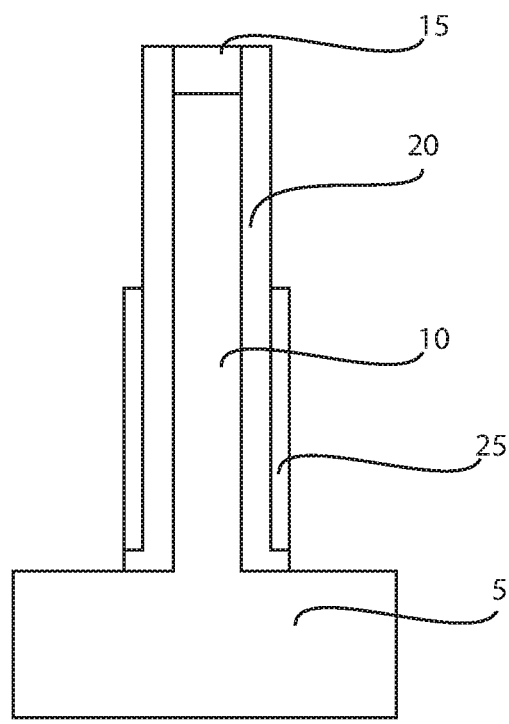
FIG. 3 is a side cross-sectional view depicting removing a portion of the masking layer from being over an active portion of the fin structure, in which a remaining portion of the masking layer may be present on the doped glass layer that is present on an isolation portion of the fin structure, in accordance with one embodiment of the present disclosure.

FIG. 3 depicts removing a portion of the masking layer 25 from an active portion of the fin structure 10, in which a remaining portion of the masking layer 25 may be present on the doped glass layer 20 that is present on an isolation portion of the fin structure 10. The active portion of the fin structure 10 includes the channel region, the source region and the drain region portions of the fin structure 10. These are the portions of the fin structure 10 in which the charge carriers are traveling during functioning of the FinFET. The isolation portion of the fin structure 10 is present between the active portion of the fin structure and the supporting substrate 1, wherein the isolation portion of the fin structure is further processed below to provide the location of the punch through stopper (PTS) region of the FinFET, which obstructs the charge carriers from leaking out of the active portion of the fin structure 10.

In some embodiments, the portion of the masking layer 25 that is removed to expose the portion of the doped glass layer 20 that is present on the active portion of the fin structure 10 is removed using an anisotropic etch, such as reactive ion etch. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation.

In some embodiments, the etch process for removing the masking layer 25 from the active portion of the fin structure 10 includes applying an anisotropic etch to remove the laterally orientated surfaces of the masking layer 25 and to recess the vertically orientated surfaces of the masking layer 25 to provide an exposed of the doped glass layer 20 that is present on the active portion of the fin structure 10. In some embodiments, the anisotropic etch that exposes the portion of the doped glass layer 20 that is present on the active portion of the fin structure 10 removes the masking layer 25 selectively to the doped glass layer 20. In some embodiments, the anisotropic etch process that etches the masking layer 25 also removes the horizontally orientated portions of the doped glass layer, such as the portions of the doped glass layer 20 present on the upper surface of the hard mask 15 and the horizontally orientated portions of the doped glass layer 20 that is present on the upper surfaces of the supporting substrate 1, as depicted in FIG. 3.

Figure 4:
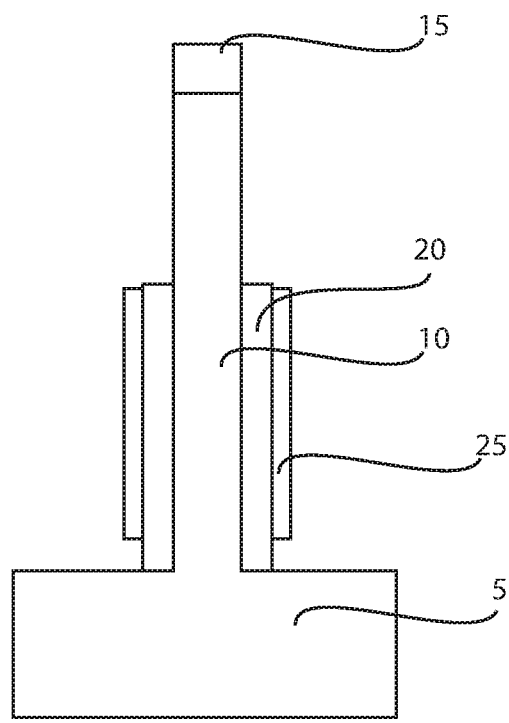
FIG. 4 is a side cross-sectional view depicting removing an exposed portion of the doped glass layer that is present on the active portion of the fin structure, wherein a remaining portion of the doped glass layer is present on the isolation portion of the fin structure, in accordance with one embodiment of the present disclosure.

FIG. 4 depicts one embodiment of removing an exposed portion of the doped glass layer 20 that is present on the active portion of the fin structure 10, wherein a remaining portion of the doped glass layer 20 is present on the isolation portion of the fin structure 10. The etch process for removing the exposed portion of the doped glass layer 20 may be a selective etch process. For example, in one embodiment, a selective etch may include an etch chemistry that removes a first material selectively to a second material by a ratio of 100:1 or greater. In some embodiments, the etch process removes the exposed portions of the doped glass layer 20 selectively to at least one of the remaining portion of the masking layer 25, the fin structure 10, the hardmask 15, and the supporting substrate 1. Following the selective etch process, a remaining portion of the doped glass layer 20 is only present on the sidewalls of the isolation portion of the fin structure 10. The etch process for removing the exposed portion of the doped glass layer 20 may be an anisotropic etch or an isotropic etch. In some examples, the etch process may be a wet chemical etch, reactive ion etch (RIE), plasma etch, laser etch and combinations thereof. In one example, the etch process for removing the exposed portion of the doped glass layer 20 is a wet oxide etch.

Figure 5:
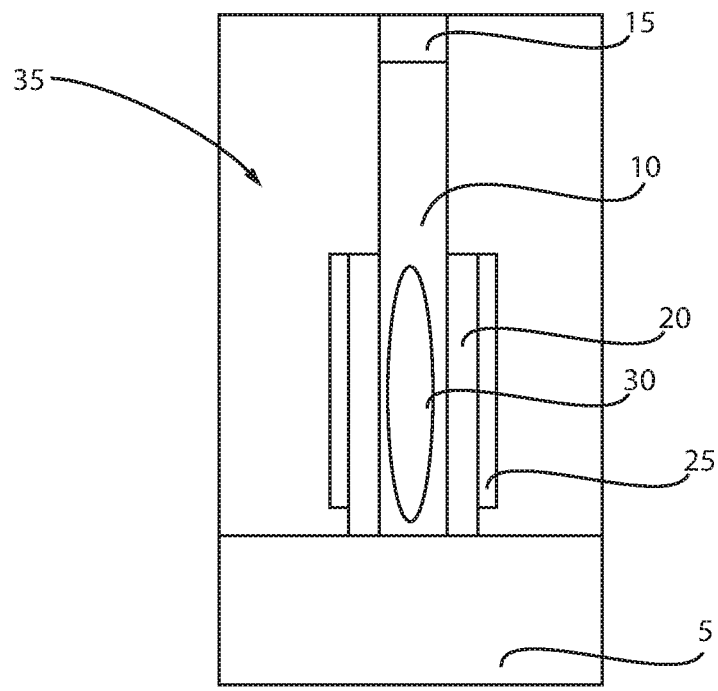
FIG. 5 is a side cross-sectional view depicting forming an isolation region and applying an anneal process to diffuse dopant from the doped glass layer into the isolation portion of the fin structure to form the punch through stop (PTS) region between the active portion of the fin structure and a supporting substrate.

FIG. 5 depicts one embodiment of forming an isolation region 35 and applying an anneal process to diffuse dopant from the doped glass layer 20 into the isolation portion of the fin structure 10 to form the punch through stop region 30 between the active portion of the fin structure 10 and the supporting substrate 1. The isolation region 35 may be composed of any dielectric material. For example, the isolation region 35 may be composed of an oxide, nitride or oxynitride material. In one example, when the isolation region 35 is composed of an oxide, the oxide may be silicon oxide. The dielectric material of the isolation region 35 may be formed using a CVD or other like deposition process. The dielectric of the isolation region 35 may be densified after deposition. For example, the isolation region 35 may be annealed.

The anneal process for densifying the isolation region 35 may also diffuse the dopant from the doped glass layer 20 that is present on the sidewalls of the isolation portion of the fin structure 10 into the interior of the isolation portion of the fin structure 10 to provide the punch though stop (PST) region 30. The anneal process may be a thermal diffusion step that can include, but is not limited to, rapid thermal annealing, furnace annealing, laser annealing and combinations thereof. In one embodiment, the thermal diffusion is completed at a first temperature ranging from 350° C. to 1000° C. for a time period ranging from 1 second to 90 seconds. In another embodiment, the thermal annealing process for forming the punch through stop (PST) region 30 may include a temperature that ranges from 600° C. to 800° C.

The punch through stop (PTS) region dopant may be an n-type or p-type dopant that has an opposite conductivity type as the dopant that determined the conductivity type of the FinFET. For example, the punch through stop (PTS) region dopant may be an n-type or p-type dopant that has an opposite conductivity type as the dopant that dictates the conductivity type of the source and drain region of the FinFET.

The punch through dopant in the punch through stop (PTS) region 30 of the isolating portion of the fin structure 10 may be present in a concentration ranging from $4\times10^{18}$ dopants/cm$^3$ to $3\times10^{19}$ dopants/cm$^3$. The channel region portion of the active portion of the fin structure 10 typically has a substantially lower concentration of punch through dopant. For example, the concentration of punch through stopper dopant that diffuses into the active portion of the fin structure 10 using the methods described with reference to FIGS. 1-5 is orders of magnitude less than the concentration of the punch through stopper dopant that is present in the channel region of device formed using prior methods, such as ion implantation.

In some embodiments, using the methods of the present disclosure, i.e., the methods described with reference to FIGS. 1-5, a tail of dopant may be present in decreasing concentration extending from the punch through stopper (PTS) region 30 into the active portion of the fin structure 10. In one embodiment, the concentration of the punch through stopper dopant in the tail may range from a high concentration extending from the punch through stopper region to a low concentration, e.g., orders of magnitude layer, at the upper surface of the active portion of the fin structure 10, on which the gate structure is formed. In one example, the concentration of punch through dopant in the tail will decrease from a high concentration of approximately $1\times10^{18}$ dopants/cm$^3$ adjacent to the punch through stopper (PTS) region 30 to a low concentration of approximately $1\times10^{17}$ dopants/cm$^3$ at the upper surface of the active portion of the fin structure 10, on which the gate structure is formed. It is noted that the above concentrations are provided for illustrative purposes only, and are not intended to limit the present disclosure to only these examples.

Figure 6:
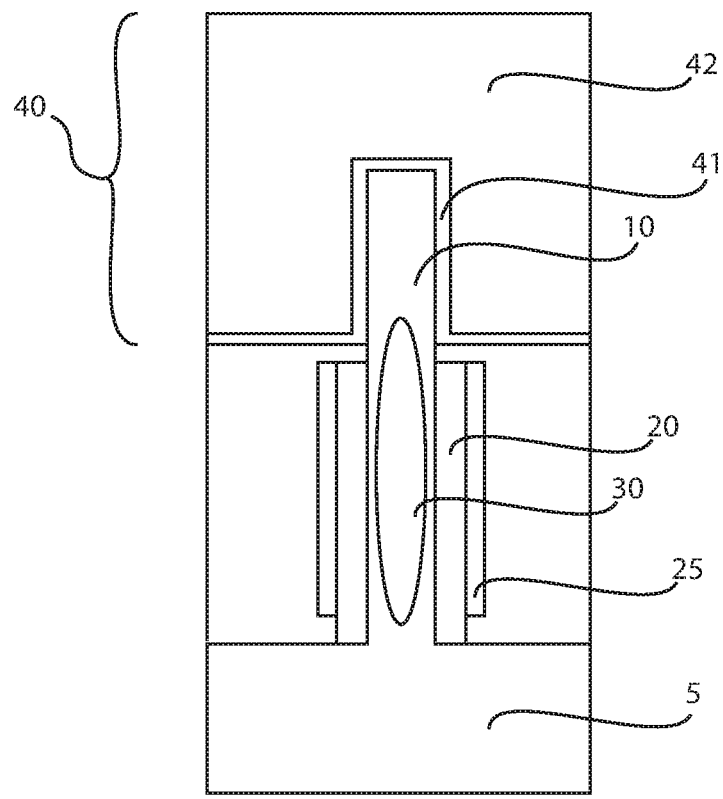
FIG. 6 is a side cross-sectional view depicting forming a gate structure on the channel region portion of the active region of the fin structure.

FIG. 6 depicts forming a gate structure 40 on the channel region portion of the active region of the fin structure 10. Forming the gate structure 40 may begin with recessing the isolation region 35 to expose the active portion of the fin structure 10. The upper surface of the isolation region 35 may be recessed using an anisotropic etch, such as reactive ion etch (RIE). The depth by which the isolation region 35 is recessed may provide a height dimension for the active portion of the fin structure 10.

The gate structure 40 typically includes at least a gate dielectric 41 that is present on the channel region of active portion the fin structure 10, and a gate electrode 42 that is present on the gate dielectric 41. In one embodiment, the at least one gate dielectric layer 41 includes, but is not limited to, an oxide, nitride, oxynitride and/or silicates including metal silicates, aluminates, titanates and nitrides. In one example, when the at least one gate dielectric layer 41 is comprised of an oxide, the oxide may be selected from the group including, but not limited to, SiO$_2$, HfO$_2$, ZrO$_2$, Al$_2$O$_3$, TiO$_2$, La$_2$O$_3$, SrTiO$_3$, LaAlO$_3$, Y$_2$O$_3$ and mixture thereof. The physical thickness of the at least one gate dielectric layer 41 may vary, but typically, the at least one gate dielectric layer 41 has a thickness from 1 nm to 10 nm. In another embodiment, the at least one gate dielectric layer 41 has a thickness from 1 nm to 3 nm.

The conductive material of the gate electrode 42 may comprise polysilicon, SiGe, a silicide, a metal or a metal-silicon-nitride such as Ta—Si—N. Examples of metals that can be used as the gate electrode 42 include, but are not limited to, Al, W, Cu, and Ti or other like conductive metals. The layer of conductive material for the gate electrode 42 may be doped or undoped. If doped, an in-situ doping deposition process may be employed. Alternatively, a doped conductive material can be formed by deposition, ion implantation and annealing. In yet another embodiment, when the fin structure 10 is being employed in a p-FinFET, the gate electrode may be composed of a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

In yet another embodiment, when the fin structure 10 is being employed in an n-FinFET, the gate electrode 42 may include an n-type work function metal layer. An "n-type work function metal layer" is a metal layer that effectuates an n-type threshold voltage shift. In one embodiment, the work function of the n-type work function metal layer ranges from 4.1 eV to 4.3 eV. In some embodiments, the n-type work function metal layer is composed of at least one of TiAl, TanN, TiN, HfN, HfSi, or combinations thereof.

The gate structure 40 may be formed by using a deposition method, such as a chemical vapor deposition method and/or a physical vapor deposition (PVD), to deposit the material layers for the at least one gate dielectric layer 41 and the at least one gate electrode 42 followed by photolithography and etch processing.

Figure 7:
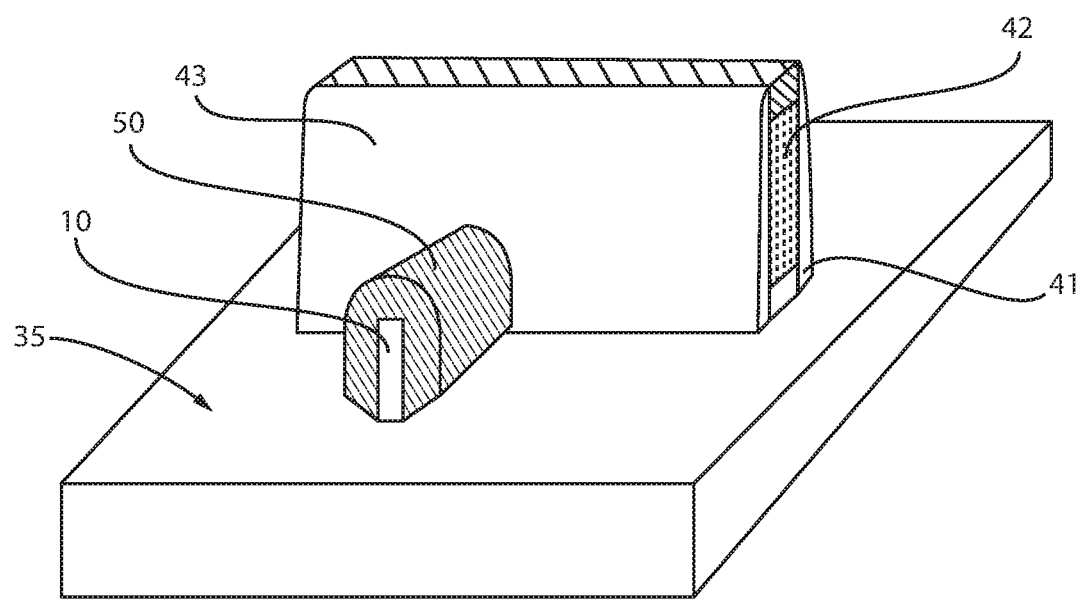
FIG. 7 is a perspective view depicting forming source and drain regions on the structure depicted in FIG. 6.

In some embodiments, a gate sidewall spacer 43 can be formed on the sidewall of the gate structure 40, as depicted in FIG. 7. In one embodiment, the gate sidewall spacer 43 may be formed by using a blanket layer deposition process, such as CVD, and an anisotropic etchback method. The gate sidewall spacer 43 may have a width ranging from 2.0 nm to 15.0 nm, and may be composed of a dielectric, such as a nitride, oxide, oxynitride, or a combination thereof.

FIG. 7 depicts one embodiment of forming source and drain regions on the source and drain region portions of the fin structure 10 that are present on opposing sides of the fin structure's channel region. The source and drain regions, as well as the channel region, are formed in the active portion of the fin structure 10, which is separated from the supporting substrate 1 by the isolating portion of the fin structure 10. Although FIG. 7 is a perspective view, that only depicts one of the source and drain regions, the other of the source and drain regions is present on the opposing side of the gate structure 40.

The source and drain regions typically include an epitaxial semiconductor material 50 that is formed on the source and drain region portions of the active portion of the fin structure 10. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus.

The epitaxial semiconductor material 50 for the source and drain regions may be a type IV semiconductor, such as silicon (Si), silicon germanium (SiGe), germanium (Ge), silicon doped with carbon (Si:C), or the epitaxial semiconductor material 50 for the source and drain regions may be at type III-V compound semiconductor material, such as gallium arsenide (GaAs). The epitaxial semiconductor material 50 may be doped to the conductivity type of the source and drain region. For example, if the semiconductor device is an n-type FinFET, the epitaxial semiconductor material 50 that is present on the source and drain region portions of the fin structure 10 is doped to an n-type conductivity; and if the semiconductor device is a p-type FinFET, the epitaxial semiconductor material 50 that is present on the source and drain region portions of the fin structure 10 is doped to a p-type conductivity. The n-type or p-type dopant in the source and drain regions may also be referred to a charge carrier type dopant.

The dopant may be introduced to the epitaxial semiconductor material 50 using in-situ doping. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material. In some embodiments, extension source and drain regions may be formed in the source and drain region portions of the active portion of the fin structure 10 by thermally diffusing the dopant from the epitaxial semiconductor material 50 into the active portion of the fin structures 10. In some embodiments, the charge carrier type dopant in said source and drain region is present in a concentration ranging from $1 \times 10^{20}$ dopants/$cm^3$ to $2 \times 10^{20}$ dopants/$cm^3$.

It is noted that in the above examples, a gate first process has been described for forming the gate structure 40. The methods and structures of the present disclosure are not limited to only this process flow, as gate last processing is also suitable for use with the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

In one embodiment, the present disclosure provides a semiconductor device, e.g., FinFET semiconductor device, that includes a fin structure 10 including an active portion and an isolating portion. The active portion of the fin structure 10 includes a channel region and source and drain regions (including in situ doped epitaxial semiconductor material 50) on opposing sides of the channel region. The isolating portion of the fin structure 10 includes a doped punch through stop (PTS) region 30 that is present underlying the channel region and the source and drain regions of the active portion. A spacer of doped glass 20 present on the isolation portion of the fin structure 10, wherein the spacer of doped glass is not present on the active portion of the fin structure 10. The spacer of doped glass 20 is a remaining portion of the doped glass layer 20 that has been described above with reference to FIGS. 1-5. A masking layer 25 may be present on the spacer of doped glass 20, in which a height of the masking layer 25 is generally equal to a height of the spacer of doped glass 20. The spacer of doped glass 20 and the masking layer 25 may be embedded within the isolation region 35. A gate structure 40 present on the channel region of the active portion of the fin structure 10. Source and drain regions are doped to a first conductivity type and the punch through stopper (PTS) region 30 is doped to a second conductivity type, said second conductivity type being opposite the first conductivity type. In one example, the charge carrier type dopant in the source and drain region may be present in a concentration ranging from $1 \times 10^{20}$ dopants/$cm^3$ to $2 \times 10^{20}$ dopants/$cm^3$; and the dopant of the doped punch through stop region in the isolating portion of the fin structure 10 may be present in a concentration ranging from $4 \times 10^{18}$ dopants/$cm^3$ to $3 \times 10^{19}$ dopants/$cm^3$. In some embodiments, a tail of punch through stopper (PTS) dopant may be present in the active portion of the fin structure 10 extending away from the punch through stopper (PTS) region 30 that is present in the isolation portion of the fin structure. The concentration of punch through dopant in the tail can range from approximately $1 \times 10^{17}$ dopants/$cm^3$ to approximately $1 \times 10^{18}$ dopants/$cm^3$.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a semiconductor pedestal structure including an active portion and an isolating portion, wherein the isolating portion of the semiconductor pedestal structure includes a doped punch through stop region separating the active portion of semiconductor pedestal structure from a supporting semiconductor substrate having a same composition as the semiconductor pedestal structure; and
   a spacer of glass present on the isolation portion of the semiconductor pedestal structure, wherein the spacer of glass has an I-shaped geometry.

2. The semiconductor device of claim 1, further comprising a source region and a drain region on opposing sides of a channel region.

3. The semiconductor device of claim 2, wherein said source and drain regions are doped to a first conductivity type and the punch through stop region is doped to a second conductivity type, said second conductivity type being opposite the first conductivity type.

4. The semiconductor device of claim 2, wherein a charge carrier type dopant in said source and drain region is present in a concentration ranging from $1 \times 10^{20}$ dopants/cm$^3$ to $2 \times 10^{20}$ dopants/cm$^3$.

5. The semiconductor device of claim 1, wherein punch through dopant in said doped punch through stop region in said isolating portion of said semiconductor pedestal structure is present in a concentration ranging from $4 \times 10^{18}$ dopants/cm$^3$ to $3 \times 10^{19}$ dopants/cm$^3$.

6. The semiconductor device of claim 1, wherein a tail of said punch through dopant is present in an active portion extending away from the isolation portion of said semiconductor pedestal structure in reducing concentration.

7. The semiconductor device of claim 1, wherein concentration of said punch through dopant in said tail ranges from $1 \times 10^{17}$ dopants/cm$^3$ to $1 \times 10^{18}$ dopants/cm$^3$.

8. A semiconductor device comprising:
   a semiconductor pedestal structure including an active portion and an isolating portion, wherein the isolating portion of the fin structure includes a doped punch through stop region separating the active portion of semiconductor pedestal structure from a supporting semiconductor substrate having a same composition as the semiconductor pedestal structure;
   a spacer of glass present on the isolation portion of the semiconductor pedestal structure, wherein the spacer of doped glass is vertically orientated and does not include a horizontally orientated portion over a substrate that the semiconductor pedestal structure is present on; and
   a hardmask dielectric spacer present on the spacer of the doped glass.

9. The semiconductor device of claim 8, further comprising a source region and a drain region on opposing sides of a channel region.

10. The semiconductor device of claim 9, wherein said source and drain regions are doped to a first conductivity type and the punch through stop region is doped to a second conductivity type, said second conductivity type being opposite the first conductivity type.

11. The semiconductor device of claim 10, wherein a charge carrier type dopant in said source and drain region is present in a concentration ranging from $1 \times 10^{20}$ dopants/cm$^3$ to $2 \times 10^{20}$ dopants/cm$^3$.

12. The semiconductor device of claim 8, wherein punch through dopant in said doped punch through stop region in said isolating portion of said semiconductor pedestal structure is present in a concentration ranging from $4 \times 10^{18}$ dopants/cm$^3$ to $3 \times 10^{19}$ dopants/cm$^3$.

13. The semiconductor device of claim 8, wherein a tail of said punch through dopant is present in the active portion extending away from the isolation portion of said semiconductor pedestal structure in reducing concentration.

14. The semiconductor device of claim 8, wherein concentration of said punch through dopant in said tail ranges from $1 \times 10^{17}$ dopants/cm$^3$ to $1 \times 10^{18}$ dopants/cm$^3$.

15. The semiconductor device of claim 8, wherein the hardmask dielectric spacer is composed of material selected from the group consisting of silicon oxide, silicon nitride and a combination thereof.

16. A semiconductor device comprising:
   a semiconductor pedestal structure including an isolating portion having a doped punch through stop region, the semiconductor pedestal structure atop a supporting semiconductor substrate having a same composition as the semiconductor pedestal structure;
   a spacer of glass present on the isolation portion of the semiconductor pedestal structure; and
   a vertically orientated hardmask dielectric spacer present on the spacer of the glass, wherein the vertically orientated hardmask dielectric spacer does not include a horizontally orientated portion over a substrate that the semiconductor pedestal structure is present on.

17. The semiconductor device of claim 16, further comprising a source region and a drain region on opposing sides of a channel region.

18. The semiconductor device of claim 17, wherein said source and drain regions are doped to a first conductivity type and the punch through stop region is doped to a second conductivity type, said second conductivity type being opposite the first conductivity type.

19. The semiconductor device of claim 18, wherein a charge carrier type dopant in said source and drain region is present in a concentration ranging from $1 \times 10^{20}$ dopants/cm$^3$ to $2 \times 10^{20}$ dopants/cm$^3$.

20. The semiconductor device of claim 19, wherein punch through dopant in said doped punch through stop region in said isolating portion of said semiconductor pedestal structure is present in a concentration ranging from $4 \times 10^{18}$ dopants/cm$^3$ to $3 \times 10^{19}$ dopants/cm$^3$.

\* \* \* \* \*